United States Patent [19]

Rossen

[11] Patent Number: 4,948,462

[45] Date of Patent: Aug. 14, 1990

[54] TUNGSTEN ETCH PROCESS WITH HIGH SELECTIVITY TO PHOTORESIST

[75] Inventor: Rebecca Rossen, Palo Alto, Calif.

[73] Assignee: Applied Materials, Inc., Santa Clara, Calif.

[21] Appl. No.: 424,486

[22] Filed: Oct. 20, 1989

[51] Int. Cl.$^5$ .................. B44C 1/22; C23F 1/02; C03C 15/00; C03C 25/06

[52] U.S. Cl. .................. 156/643; 156/626; 156/646; 156/656; 156/659.1; 204/192.33; 204/192.35; 252/79.1

[58] Field of Search .............. 156/626, 627, 643, 646, 156/656, 659.1, 662, 664, 345; 204/192.32, 192.33, 192.35; 437/228, 245; 427/38, 39; 252/79.1

[56] References Cited

U.S. PATENT DOCUMENTS

| | | | |
|---|---|---|---|
| 4,491,499 | 1/1985 | Jerde et al. | 156/626 |
| 4,579,623 | 4/1986 | Suzuki et al. | 156/626 |
| 4,609,426 | 9/1986 | Ogawa et al. | 156/626 |
| 4,713,141 | 12/1987 | Tsang | 156/643 |
| 4,842,683 | 6/1989 | Cheng et al. | 156/345 |

Primary Examiner—William A. Powell
Attorney, Agent, or Firm—Paul L. Hickman; John P. Taylor

[57] ABSTRACT

A process is disclosed for the etching of a tungsten layer on a semiconductor wafer through a photoresist mask to form a pattern of tungsten lines on the wafer. The process is characterized by a high selectivity to photoresist material and resistance to lateral etching or undercutting of the tungsten beneath the photoresist mask resulting in good profile control, i.e., low critical dimension loss in the etched tungsten pattern. The process comprises flowing $SF_6$, $N_2$, $Cl_2$ gases into an etch chamber while maintaining a plasma in the chamber. In a preferred embodiment, the wafer in the etch chamber is immersed in a magnetic field during the etch to further enhance the selectivity of the etch to photoresist.

25 Claims, 3 Drawing Sheets

FLOWING SF$_6$, N$_2$, AND Cl$_2$ GASES INTO AN ETCH CHAMBER CONTAINING A SEMICONDUCTOR WAFER HAVING A PHOTORESIST MASKED TUNSTEN LAYER

MAINTAINING A PLASMA IN THE CHAMBER WHILE THE GASES ARE FLOWING INTO THE CHAMBER TO ETCH THE TUNGSTEN LAYER

OPTIONALLY IMMERSING THE WAFER IN THE CHAMBER IN A MAGNETIC FIELD DURING THE ETCH TO INCREASE THE SELECTIVITY TO PHOTORESIST

PRODUCING A TUNGSTEN PATTERN ON A SEMICONDUCTOR WAFER CHARACTERIZED BY A CRITICAL DIMENSION SUBSTANTIALLY EQUAL TO THE CRITICAL DIMENSION ON THE PHOTORESIST PATTERN

Figure 4

TUNGSTEN ETCH PROCESS WITH HIGH SELECTIVITY TO PHOTORESIST

BACKGROUND OF THE INVENTION

1. Field of the Invention

This invention relates to an improved process for etching tungsten on a semiconductor wafer. More particularly, this invention relates to an improved process for etching a layer of tungsten having a patterned layer of photoresist wherein the etch process is very selective to photoresist and exhibits low critical dimension loss.

2. Description of the Related Art

In the formation of tungsten lines in an integrated circuit structure formed on a semiconductor wafer, it is important to provide an etch process which is highly selective to the patterned mask layer, i.e., will preferentially etch the exposed portions of the underlying tungsten layer, not the mask layer.

This has become increasingly important in the formation of VLSI structures where both the line width and the pitch (line width plus spacing between lines) of the structure is very small, i.e., about 0.6 micron line width and 1.5 micron pitch. If the mask material, such as a patterned photoresist layer, is also etched during the etching process, in particular, if the sidewalls of the mask openings are etched, the resulting tungsten line width will be unacceptably smaller than the original mask width, sometimes referred to as the critical dimension.

This is shown in FIG. 1 wherein portions 10 of a photoresist pattern are shown over tungsten lines 20 formed (by a prior art process) on a semiconductor wafer 30 containing other portions of a integrated circuit structure. The "critical dimension" shown in the FIGURE indicates the critical line width dimension which should have been etched in the tungsten layer. Dotted lines 12 (exaggerated for illustrative purposes) indicate how much the lateral dimensions of portions 10 of the photoresist pattern were shrunk or eroded by the etch resulting in a narrower line width, i.e., smaller critical dimension, of tungsten lines 20 in comparison to dotted lines 22 which indicate what the desired line width of the tungsten lines should have been.

The critical dimension of line width of the tungsten line may also be affected by an undercutting or erosion of the width of the tungsten line. This problem is depicted in FIG. 2 wherein tungsten lines 24 on wafer 30 are indicative of how the sidewalls of the openings in the tungsten layer may be laterally etched, even when photoresist mask portions 10' were not laterally etched, resulting in an unacceptable narrowing of the critical dimension of line width of the tungsten line being formed.

It would, therefore, be desirable to provide a process for etching a tungsten layer through a photoresist mask layer wherein the critical dimension of the resulting tungsten lines would not be materially reduced due to either etching of the sidewalls of the openings in the photoresist mask or to undercut erosion of the tungsten layer by lateral etching of the tungsten beneath the photoresist mask.

Summary of the Invention

It is, therefore, an object of this invention to provide an improved process for the etching of a tungsten layer through a patterned photoresist layer which is highly selective to photoresist and which will not laterally etch portions of the tungsten layer beneath the patterned photoresist layer.

It is another object of this invention to provide a process for etching a tungsten layer through a patterned photoresist layer by flowing $SF_6$, $N_2$, and $Cl_2$ gases into an etch chamber while maintaining a plasma in the chamber resulting in an etch process which is highly selective to photoresist and which will not laterally etch portions of the tungsten layer beneath the patterned photoresist layer.

It is yet another object of this invention to provide a process for plasma etching a tungsten layer on a semiconductor wafer through a patterned photoresist layer by flowing $SF_6$, $N_2$, and $Cl_2$ gases into an etch chamber while maintaining a plasma in the chamber and while immersing the wafer in a magnetic field having a magnetic moment parallel to the plane of the wafer resulting in a tungsten etch process which is highly selective to photoresist and which will not laterally etch portions of the tungsten layer beneath the patterned photoresist layer.

It is a further object of this invention to provide a method for monitoring the end point of a plasma etching process which comprises forming a patterned layer of a material which does not contain nitrogen on a semiconductor wafer by flowing gases, including nitrogen, into an etch chamber while maintaining a plasma in the chamber, said method of monitoring the end point of the etch process comprising monitoring the emission intensity of one or more lines in the nitrogen emission spectra and stopping said etch process when the intensity of the emission spectra rises to a maximum and then levels off.

These and other objects of the invention will be apparent from the following description and accompanying drawings.

Brief Description of the Drawings

FIG. 4 is a flow sheet illustrating the process of the invention.

Detailed Description of the Invention

The invention provides an improved process for the etching of a tungsten layer through a photoresist mask to form a pattern of tungsten lines on a semiconductor wafer. The process is characterized by a high selectivity to photoresist material and resistance to lateral etching or undercutting of the tungsten beneath the photoresist mask resulting in good profile control, i.e., low critical dimension loss in the etched tungsten pattern.

By use of the term "high selectivity to photoresist" is meant an etch ratio of tungsten to photoresist of at least about 2:1, preferably 2.2:1, and most preferably about 2.5:1.

By use of the terms "good profile" and "low critical dimension loss" is meant an etch wherein the tungsten underlying the photoresist mask is not eroded or undercut by lateral etching of the tungsten and the photoresist mask is not laterally etched, either of which would otherwise result in undesirable narrowing of the critical line width dimension of the resulting tungsten lines formed, by the process of the invention, from the tungsten layer.

The critical dimension or "CD" loss may be further defined as the original width of the photoresist mask (over a line to be etched in the tungsten layer) minus the actual width of the tungsten line formed by the etch process. The process of the invention has, for example, been found to have a CD loss of less than 0.1 micron when measured in a structure having 0.6 micron line widths and 1.5 micron line pitch.

Figure 1:
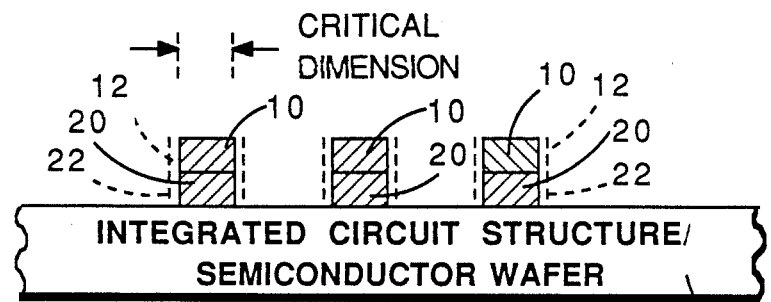
FIG. 1 is a fragmentary vertical cross-sectional view of tungsten lines formed by etching a tungsten layer on a semiconductor wafer with a patterned photoresist layer over the tungsten layer showing the effects of a prior art tungsten etch process where lateral etching of the photoresist mask resulted in shrinking of the critical line width dimension of the resulting tungsten lines.
Figure 2:
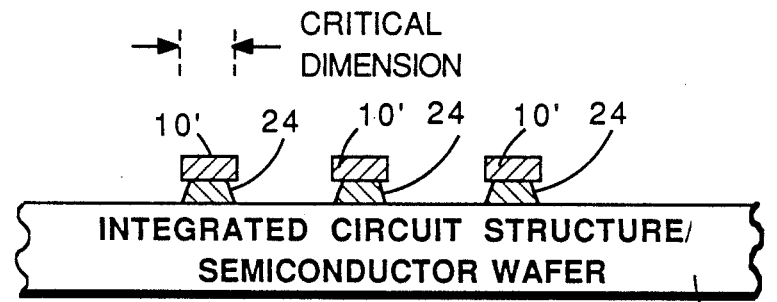
FIG. 2 is a fragmentary vertical cross-sectional view of a semiconductor wafer showing the effects of a prior art tungsten etch process which resulted in a lateral undercutting or erosion of the tungsten layer beneath the photoresist mask which also results in the shrinking of the critical line width dimension of the resulting tungsten lines.
Figure 3:
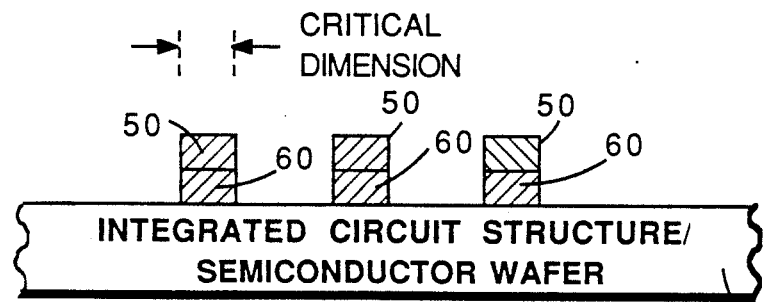
FIG. 3 is a fragmentary vertical cross-sectional view showing tungsten lines formed on a semiconductor wafer after etching a tungsten layer through a photoresist mask in accordance with the process of the invention.

FIG. 3 illustrates the structure resulting from the practice of the process of the invention wherein photoresist mask portions 50 are formed over a tungsten layer 30 on a semiconductor wafer 70 which may have other integrated circuit structure already formed therein. Etching of the tungsten layer through photoresist mask portions 50 results in the formation of the illustrated tungsten lines 60 without undercutting of the mask by lateral etching of the tungsten beneath mask portions 50 and without substantial reduction of the critical dimension by lateral etching of the photoresist mask.

The process of the invention may be carried out in any commercially available etching apparatus, such as reactive ion etching or plasma etching apparatus. Preferably, however, the process of the invention is carried out in a magnetically enhanced etching apparatus, most preferably wherein a magnetic field is generated with a magnetic moment lying in a plane parallel to the plane of the semiconductor wafer containing the tungsten layer being etched. An example of such an apparatus useful in the practice of this invention may be found in Cheng et al U.S. Pat. No. 4,842,683, entitled MAGNETIC FIELD-ENHANCED PLASMA ETCH REACTOR, which issued on June 27, 1989 and assigned to the assignee of this invention, cross-reference to which is hereby made.

In accordance with the invention $SF_6$, $N_2$, and $Cl_2$ gases are flowed into the etch chamber of the apparatus during the etching. $SF_6$ gas is flowed into the etch chamber at a rate within ranges of from about 10 to about 200 standard cubic centimeters/minute (sccm), preferably from about 50 to about 175 sccm, and most preferably from about 145 to about 155 sccm.

While higher flow rates of $SF_6$ have been found to increase the selectivity of the etch to photoresist, i.e., will increase the preference for etching tungsten, increasing the flow rate will (without a corresponding increase in vacuum pump capacity) result in an increase of the pressure which can increase "microloading" wherein proper etching in tight spots, i.e., between closely spaced apart lines, is inhibited. Therefore, the flow rate of $SF_6$ into the chamber should not exceed an amount which would, together with the flow rates of the other gases, result in a pressure within the etch chamber of greater than about 100 millitorr.

Pressures below 100 millitorr may be used, of course, and are actually desirable to achieve desired etching in tight spots. However, the desirability of operating at low pressure, i.e., pressures of about 50 millitorr, or even as low as about 10 millitorr, must be balanced against the desire for high flows of $SF_6$ to increase the tungsten etch rate, and the availability of high volume vacuum pump equipment.

The flow rate of $N_2$ into the etch chamber should be within a range of from about 2 to about 15 volume percent of the $SF_6$ flow rate into the chamber and preferably from about 8 to about 12 volume percent of the $SF_6$ flow rate.

The flow rate of $Cl_2$ into the etch chamber should be within a range of from about 2 to about 15 volume percent of the $SF_6$ flow rate into the chamber and preferably from about 8 to about 15 volume percent of the $SF_6$ flow rate.

The temperature of the wafer being etched should be maintained below about 25° C., preferably about 20° C. to maintain good profile control. The chuck or cathode on which the wafer is mounted is usually cooled to achieve such cooling and temperature control of the wafer.

The plasma ignited in the etch chamber during the process of the invention should be maintained within a power range of from about 50 to 300 watts, and preferably from about 150 to about 300 watts. Lower power levels may be used without harm, but will result in slowing down the etch rate.

The etch process of the invention is carried out until the tungsten layer has been etched through to the underlying layer, which usually will be an layer such as a titanium nitride or titanium tungsten layer. Although the particular etch chemistry will not significantly etch such materials, to avoid undercutting (sidewall etching) of the tungsten layer after the underlying layer has been reached, monitoring of the end point of the etch is advisable.

In a particular embodiment of the invention, monitoring of the end point of an etch, which utilizes $N_2$ as one of the gases, can be made by monitoring the intensity of one or more lines in the nitrogen emission spectra, for example, the 653 nm line, for a peak or rise in intensity which will indicate the end point of the etch. A rise in the intensity of emission to a maximum followed by a leveling off signifies that the etch process has reached an endpoint and the etch should be stopped.

Figure 5:
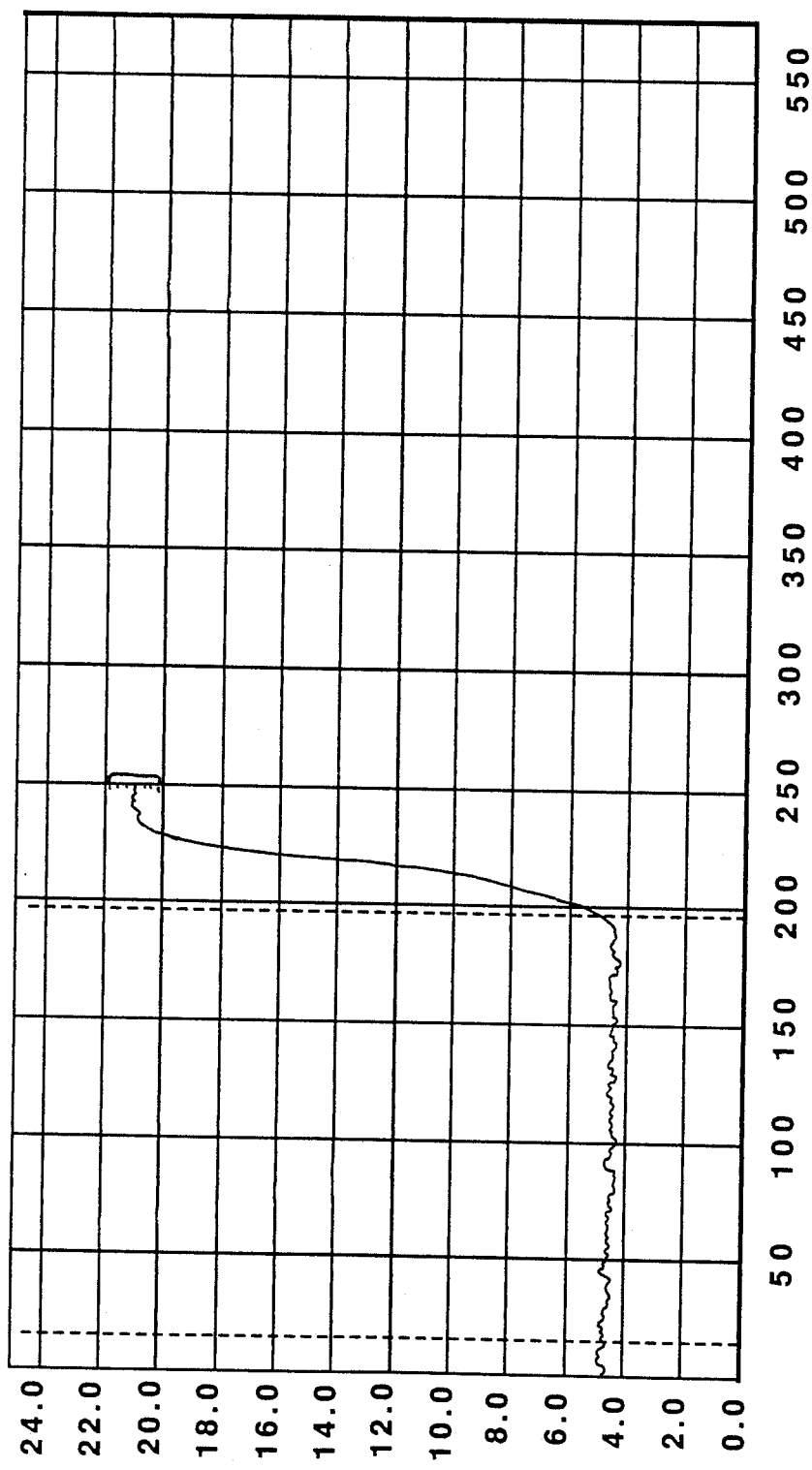
FIG. 5 is a graph plotting the emission intensity of the 653 nm nitrogen line against time which shows the use of nitrogen emission intensity as an end point determination for an etch using $N_2$.

For example, referring to the graph of FIG. 5, when a tungsten layer, having an underlying layer of titanium nitride, is etched using the process of the invention, a sharp rise in intensity of the 653 nm nitrogen emission line after about 200 seconds, from about 4.0 to about 5.0, and which peaks at about 225 seconds at about 21.0 indicates that the tungsten layer has been etched through to the underlying layer. Monitoring a nitrogen emission line for an endpoint may be accomplished, for example, using a Xinix Etch Endpoint Controller which may be mounted directly to the etch chamber for monitoring such emission through a window in the etch chamber.

In a preferred embodiment, the etch process of the invention is carried out while immersing the wafer in the etch chamber in a magnetic field. Such magnetic enhancement of the etch process of the invention results in an increased selectivity of the etch by reducing the amount of photoresist being etched without having any appreciable affect on the tungsten etch rate, thus effectively increasing the selectivity of the etch.

For example, providing a field strength of 120 gauss results in an etch ratio of tungsten to photoresist of about 2.2:1, while increasing the magnetic field strength to 140 gauss increases the etch ratio to 2.8:1.

In accordance with the invention, the field strength of the magnetic field should be at least about 100 gauss, and preferably at least about 120 gauss. The maximum field strength will depend upon the capability of the magnetic source. No particular maximum field strength need be observed other than such equipment constraints. The magnetic field may be generated either by permanent magnets or by electromagnets. Preferably, the magnetic field is generated by electromagnets disposed around the periphery of the etch chamber and the magnetic axis may be rotated in a plane parallel to the plane of the wafer, for example, at about 0.5 Hz, by alternate energizing of the electromagnetic coils as described in more detail in the aforementioned Cheng et al U.S. Pat. No. 4,842,683.

To further illustrate the process of the invention, a 150 millimeter diameter silicon wafer was coated with a 0.55 micron thick layer of tungsten and a photoresist mask was formed over the tungsten layer by deposition of a layer of photoresist material, followed by exposure of the photoresist layer to photolithography to form a photoresist mask pattern with 0.6 micron line width and a 1.5 micron line pitch.

The masked wafer was mounted to the cathode of an etch chamber and cooled to about 20° C. while about 145 sccm of $SF_6$, about 16 sccm of $N_2$, and about 16 sccm of $Cl_2$ were flowed into the chamber while maintaining the pressure in the chamber at about 80 millitorr. A plasma was ignited in the etch chamber and maintained at a power level of about 150 watts. Electromagnetic coils dispersed around the etch chamber were energized during the etch to immerse the masked wafer in the chamber in a magnetic field of about 120 gauss with a magnetic moment lying in a plane parallel to the plane of the wafer and rotated in that plane at a frequency of about 0.5 Hz.. The etch process was continued until an large increase was observed in the intensity of the 653 nm nitrogen line being monitored signifying the end of the etching of the tungsten layer.

The etched wafer was then removed from the etch chamber and the wafer was cross-sectioned and then examined under a scanning electron microscope (SEM) to determine whether any lateral etching of the photoresist mask had taken place. The width of the photoresist line patterns was found to be of substantially the same dimension as before the etch indicating that little, if any, lateral etching of the photoresist mask had occurred indicating the excellent selectivity of the etch process of the invention. The tungsten lines were also examined for undercutting and less than 0.1 micron of critical dimension loss was observed.

Thus, the tungsten etch process of the invention provides a high selectivity to photoresist wherein lateral etching of the photoresist mask is minimal and undercutting or erosion of the tungsten under the photoresist mask is also minimal resulting in a good profile and low critical line width loss in the tungsten patterned formed on the semiconductor wafer.

Having thus described the invention, what is claimed is:

1. A process for etching a tungsten layer on a semiconductor wafer through a patterned photoresist layer which is highly selective to photoresist and which will not laterally etch portions of the tungsten layer beneath the patterned photoresist layer which process comprises:
   (a) flowing $SF_6$, $N_2$, and $Cl_2$ gases into an etch chamber containing said semiconductor wafer; and
   (b) maintaining a plasma in said chamber during said gas flow;
to thereby etch said tungsten layer while maintaining a good profile in said etched tungsten layer.

2. The process of claim 1 wherein said step of flowing said $SF_6$ into said etch chamber further comprises flowing said $SF_6$ gas into said chamber at a rate within a range of from about 10 to about 200 sccm.

3. The process of claim 2 wherein said step of flowing said $N_2$ into said etch chamber further comprises flowing said $N_2$ gas into said chamber at a rate within a range of from about 2 to about 15 volume percent of said $SF_6$ flow rate.

4. The process of claim 2 wherein said step of flowing said $Cl_2$ into said etch chamber further comprises flowing said $Cl_2$ gas into said chamber at a rate within a range of from about 2 to about 15 volume percent of said $SF_6$ flow rate.

5. The process of claim 1 wherein said step of maintaining said plasma in said etch chamber during said gas flow further comprises maintaining said plasma at a power level within a range of from about 50 to 300 watts.

6. The process of claim 1 including the further step of immersing said wafer in said etch chamber in a magnetic field during said etch process.

7. The process of claim 6 wherein said magnetic field has a magnetic moment lying in a plane parallel to the plane of said wafer in said etch chamber.

8. The process of claim 6 wherein the field strength of said magnetic field is at least about 100 gauss.

9. The process of claim 1 including the further step of monitoring the intensity of the emission spectra of one or more lines of nitrogen to determine the end point of said tungsten etch based on a rise in intensity of said nitrogen emission.

10. A process for plasma etching a tungsten layer on a semiconductor wafer through a patterned photoresist layer which is highly selective to photoresist and which will not laterally etch portions of said tungsten layer beneath said patterned photoresist layer, which process comprises:
   (a) flowing $SF_6$, $N_2$, and $Cl_2$ gases into an etch chamber containing said semiconductor wafer;
   10 (b) maintaining a plasma in said chamber during said gas flow; and
   (c) immersing said wafer in said chamber wafer in a magnetic field; to thereby etch said tungsten layer while maintaining a good profile in said etched tungsten layer.

11. The process of claim 10 wherein the pressure in said chamber is maintained within a range of from about 10 to about 100 millitorr.

12. The process of claim 11 wherein said step of flowing said $SF_6$ into said etch chamber further comprises flowing said $SF_6$ gas into said chamber at a rate within a range of from about 50 to about 175 sccm.

13. The process of claim 12 wherein said step of flowing said $N_2$ into said etch chamber further comprises flowing said $N_2$ gas into said chamber at a rate within a range of from about 8 to about 12 volume percent of said $SF_6$ flow rate.

14. The process of claim 12 wherein said step of flowing said $Cl_2$ into said etch chamber further comprises flowing said $Cl_2$ gas into said chamber at a rate within a range of from about 8 to about 15 volume percent of said $SF_6$ flow rate.

15. The process of claim 10 wherein said step of maintaining said plasma in said etch chamber during said gas flow further comprises maintaining said plasma at a power level within a range of from about 150 to 300 watts.

16. The process of claim 10 wherein said step of immersing said wafer in said etch chamber in a magnetic field during said etch process further comprises immersing said wafer in a magnetic field having a magnetic moment lying in a plane parallel to the plane of said wafer.

17. The process of claim 16 wherein said step of immersing said wafer in said etch chamber in a magnetic field during said etch process further comprises rotating the magnetic moment of said magnetic field in a plane parallel to the plane of said wafer.

18. The process of claim 10 wherein said step of immersing said wafer in said etch chamber in a magnetic field during said etch process further comprises maintaining the field strength of said magnetic field within a range of from about 100 to about 150 gauss.

19. The process of claim 10 wherein the temperature of said wafer in said etch chamber doe not exceed 25° C. during said etch.

20. A process for plasma etching a tungsten layer on a semiconductor wafer through a patterned photoresist layer which is highly selective to photoresist and which will not laterally etch portions of said tungsten layer beneath said patterned photoresist layer, which process comprises:
   (a) flowing $SF_6$, $N_2$, and $Cl_2$ gases into an etch chamber containing said semiconductor wafer at flow rates within ranges of:
      (1) from about 50 to about 175 sccm of $SF_6$;
      (2) from about 2 to about 15 volume percent of said $SF_6$ flow rate of $N_2$; and
      (3) from about 2 to about 15 volume percent of said $SF_6$ flow rate of $Cl_2$;
   (b) maintaining a plasma in said chamber during said gas flow within a power range of from about 10 to about 300 watts; and
   (c) immersing said wafer in said chamber wafer in a magnetic field having a magnetic moment parallel to the plane of said wafer and a magnetic field strength of at least about 100 gauss;
to thereby etch said tungsten layer while maintaining a good profile in said etched tungsten layer.

21. The process of claim 20 wherein the pressure in said chamber is maintained within a range of from about 10 to about 100 millitorr.

22. The process of claim 20 wherein the temperature of said wafer in said etch chamber doe not exceed 25° C. during said etch.

23. A process for plasma etching a tungsten layer on a semiconductor wafer through a patterned photoresist layer which is highly selective to photoresist and which will not laterally etch portions of said tungsten layer beneath said patterned photoresist layer, which process comprises:
   (a) flowing $SF_6$ at a rate within a range of from about 145 to about 155 sccm into an etch chamber containing said semiconductor wafer;
   (b) flowing $N_2$ into said chamber at a rate of from about 8 to about 12 volume percent of said $SF_6$ flow rate into said chamber;
   (c) flowing $Cl_2$ into said chamber at a rate of from about 8 to about 15 volume percent of said $SF_6$ flow rate into said chamber;
   (d) maintaining a plasma in said chamber during said gas flow within a power range of from about 150 to about 300 watts;
   (e) immersing said wafer in said chamber wafer in a magnetic field having a magnetic moment parallel to the plane of said wafer and a magnetic field strength within a range of from about 100 to about 150 gauss; and
   (f) rotating said magnetic moment in said plane parallel to the plane of said wafer during said etch; to thereby etch said tungsten layer while maintaining a good profile in said etched tungsten layer.

24. A process for plasma etching a tungsten layer on a semiconductor wafer through a patterned photoresist layer which is highly selective to photoresist and which will not laterally etch portions of said tungsten layer beneath said patterned photoresist layer, which process comprises:
   (a) flowing $SF_6$, $N_2$, and $Cl_2$ gases into an etch chamber containing said semiconductor wafer;
   (b) maintaining a plasma in said chamber during said gas flow; and
   (c) monitoring the intensity of the nitrogen emission spectra of one or more nitrogen lines for a rise in intensity of said nitrogen emission spectra to determine the endpoint of said etch;
to thereby etch said tungsten layer while maintaining a good profile in said etched tungsten layer.

25. A method of determining the end point of a plasma etch wherein nitrogen is used as one of the gases in the etch chamber to etch a material which does not contain nitrogen, which method comprises monitoring the intensity of the nitrogen emission spectra of one or more nitrogen lines for a rise in intensity of said nitrogen emission spectra to a maximum followed by a leveling off.

* * * * *